United States Patent

[11] 3,579,060

[72] Inventor Robert L. Davis
Union Springs, N.Y.

[21] Appl. No. 809,142
[22] Filed Mar. 21, 1969
[45] Patented May 18, 1971
[73] Assignee General Electric Company

[54] THYRISTOR WITH IMPROVED CURRENT AND VOLTAGE HANDLING CHARACTERISTICS
11 Claims, 9 Drawing Figs.

[52] U.S. Cl. ........................................................ 317/235R, 317/234N, 317/234P, 317/235AA, 317/235AB
[51] Int. Cl. ........................................................ H01l 11/00, H01l 15/00
[50] Field of Search ........................................... 315/234, 235, 5.4, 6, 40.13, 41, 41.1

[56] References Cited

UNITED STATES PATENTS

| | | | |
|---|---|---|---|
| 2,963,390 | 12/1960 | Dickson ........................ | 317/235X |
| 3,476,989 | 11/1969 | Miles et al. .................... | 317/235 |
| 3,486,088 | 12/1969 | Gray et al. ..................... | 317/235 |

FOREIGN PATENTS

| | | | |
|---|---|---|---|
| 935,710 | 9/1963 | Great Britain ................ | 317/235 |
| 1,081,224 | 8/1967 | Great Britain ................ | 317/235 |
| 91,476 | 5/1968 | France .......................... | 317/235 |

*Primary Examiner*—John W. Huckert
*Assistant Examiner*—Andrew J. James
*Attorneys*—Robert J. Mooney, Nathan J. Cornfeld, Carl O. Thomas, Frank L. Neuhauser, Oscar B. Waddell and Joseph B. Forman ABSTRACT: A controlled rectifier is disclosed which is comprised of a main current carrying thyristor which surrounds an integrated gate signal amplifying thyristor. The main thyristor is peripherally beveled to increase the voltage blocking capabilities of the controlled rectifier. The surface of the base layer of the main thyristor is provided with an exposed surface lying at a lower level than the surface of the adjacent emitter layer of the main thyristor, and the exposed base layer surface is interdigitated with the adjacent emitter layer. A metallic contact ohmically connects an emitter layer of the amplifying thyristor to the exposed base layer surface of the main. thyristor. The base layer of the main thyristor is also provided with exposed surface portions coplanar with the adjacent emitter layer surface at locations most remote from the fingers of the base layer surface. Additionally, a relatively high resistance current spreading path is provided associated with the emitter layer of the amplifying thyristor, and the amplifying thyristor emitter layer is provided with a minimum spacing from the control lead adjacent the spreading path.

Patented May 18, 1971 3,579,060

3 Sheets-Sheet 1

INVENTOR:
ROBERT L. DAVIES,

BY Carl O. Thomas
HIS ATTORNEY.

INVENTOR:
ROBERT L. DAVIES,

BY Carl O. Thomas
HIS ATTORNEY.

INVENTOR:
ROBERT L. DAVIES,

BY Carl O. Thomas
HIS ATTORNEY.

THYRISTOR WITH IMPROVED CURRENT AND VOLTAGE HANDLING CHARACTERISTICS

My invention is directed to gate controlled rectifiers having improved switching capabilities.

As is well understood, gate controlled rectifiers are limited in the terminal applied potential difference that can be safely blocked, by the rate at which terminal voltage can be increased, by the rate at which current conduction can be increased, and by the rate at which turn on can be repeated. Various approaches have been suggested for improving each of the above characteristics. Unfortunately, such approaches frequently succeed merely in improving one characteristic at the expense of another.

I have invented a gate controlled rectifier which is capable of safely blocking high levels of applied voltage and which is also capable of handling rapid increases in voltage and current without adverse effect. Also my gate controlled rectifier is capable of functioning with higher rates of repetitive turn on. Further, my controlled rectifier is capable of more reliably functioning with a weak gate signal than are conventional controlled rectifiers with comparable current handling capabilities.

In one aspect my invention is directed to a controlled rectifier comprised of a main current carrying semiconductive means and gate signal amplifying semiconductive means each having first, second, third, and fourth layers, adjacent of the layers being of opposite conductivity type and forming junctions therebetween. The second, third, and fourth layers of the main semiconductive means and the amplifying semiconductive means are integrally related. The first layer of the amplifying semiconductive means is annular and separates the surfaces of the second layers of the amplifying and main semiconductive means. Also, the second layer surface of the main semiconductive means separates the first layers of the amplifying and main semiconductive means. Means are provided to form a low impedance electrical interconnection between the first layer of the amplifying semiconductive means and the second layer of the main semiconductive means. Gate means is associated with the second layer surface of the amplifying semiconductive means. Means are associated with the first layer of the amplifying semiconductive means to forestall turn off of the amplifying semiconductive means prior to turn on of the main semiconductive means, and first and second main current carrying terminal means are associated with the first layer of the main semiconductive means and the fourth layers of the semiconductive means, respectively.

In another aspect my invention is directed to a controlled rectifier comprised of a semiconductive element having two emitter layers and two intermediate base layers, with adjacent layers being of opposite conductivity type and forming junctions therebetween. One of the emitter layers is comprised of an annular pilot portion and a main portion. A base layer adjacent the one emitter layer has a pilot gate surface portion and a main gate surface portion separated by the pilot portion of the one emitter layer. Gate means is associated with the pilot gate surface portion. The main gate surface portion is located nearer to the remaining emitter layer than is the surface of the one emitter layer. The one main gate surface portion is comprised of a portion associated with an edge of the annular pilot portion and a plurality of finger portions radiating from the associated portion in interdigited relationship with the main portion of the one emitter layer. Low impedance electrically conductive means interconnects the annular pilot portion of the one emitter layer to the main gate surface portion of the adjacent base layer. First main current carrying terminal means is associated with the main portion of the one emitter and overlies the main gate surface portion and the low impedance electrically conductive means in spaced, nonconductive relation thereto. A second main current carrying terminal means is associated with the remaining emitter layer of the semiconductive element.

My invention may be better understood by reference to the following detailed description considered in conjunction with the drawings, in which.

Figures 1, 2:
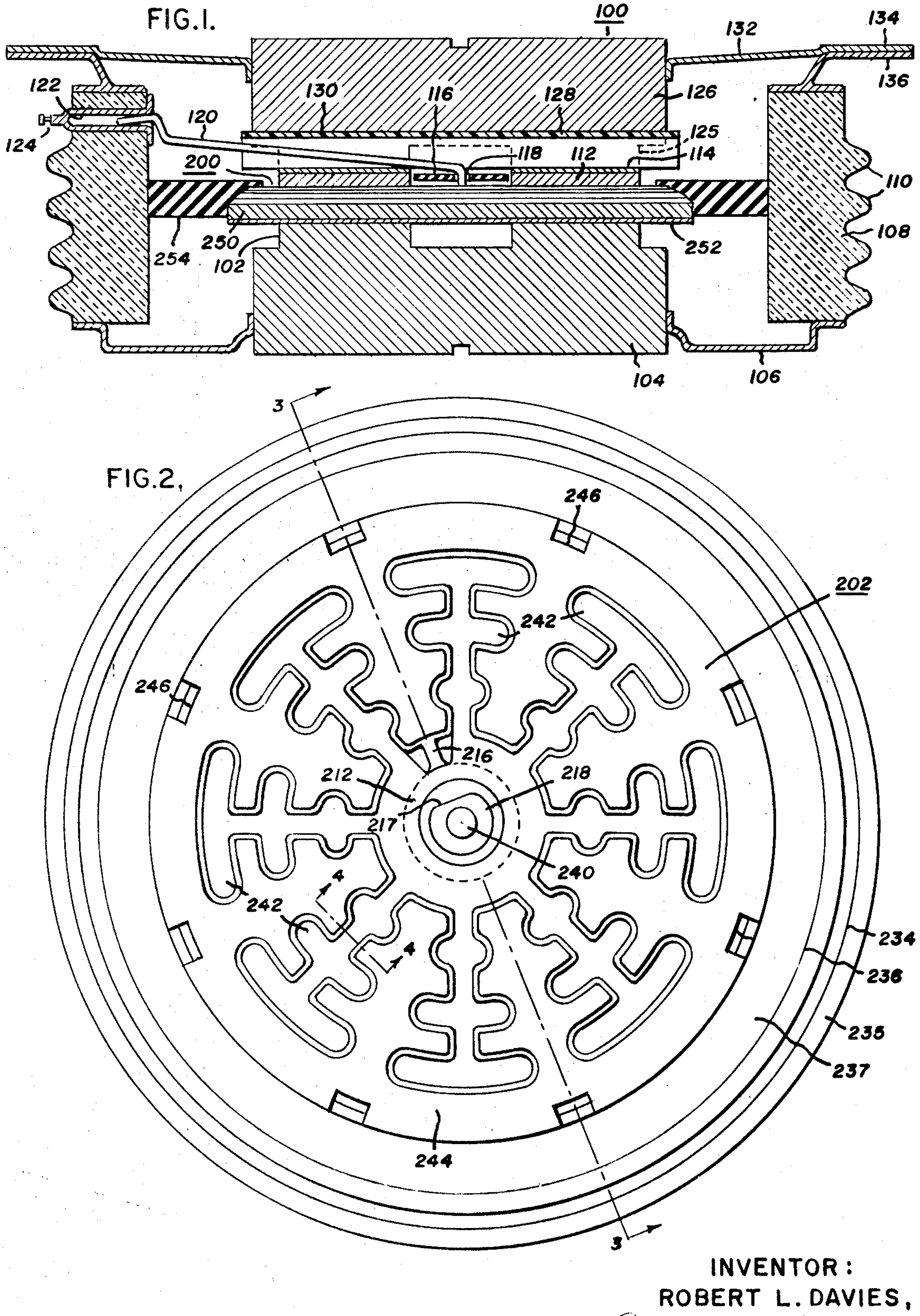
FIG. 1 is a vertical section of a controlled rectifier according to my invention with the semiconductive element and the associated cathode contact layer being shown in elevation.
FIG. 2 is a plan view of the semiconductive element with the cathode contact layer, the main gate contact layer, and the pilot gate contact layer applied.
Figure 3:
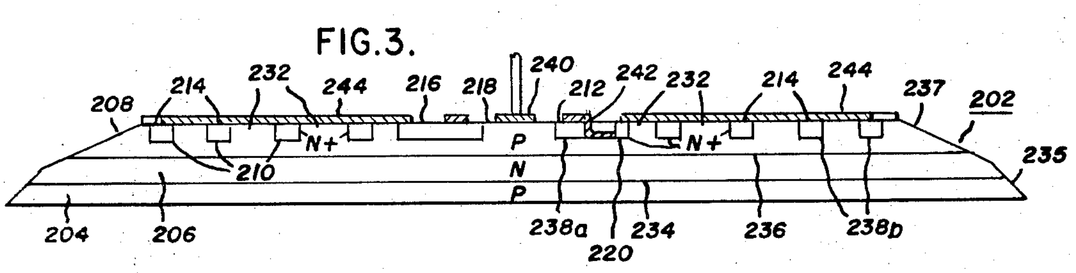
FIG. 3 is a section taken along section line 3—3 in FIG. 2.
Figure 5:
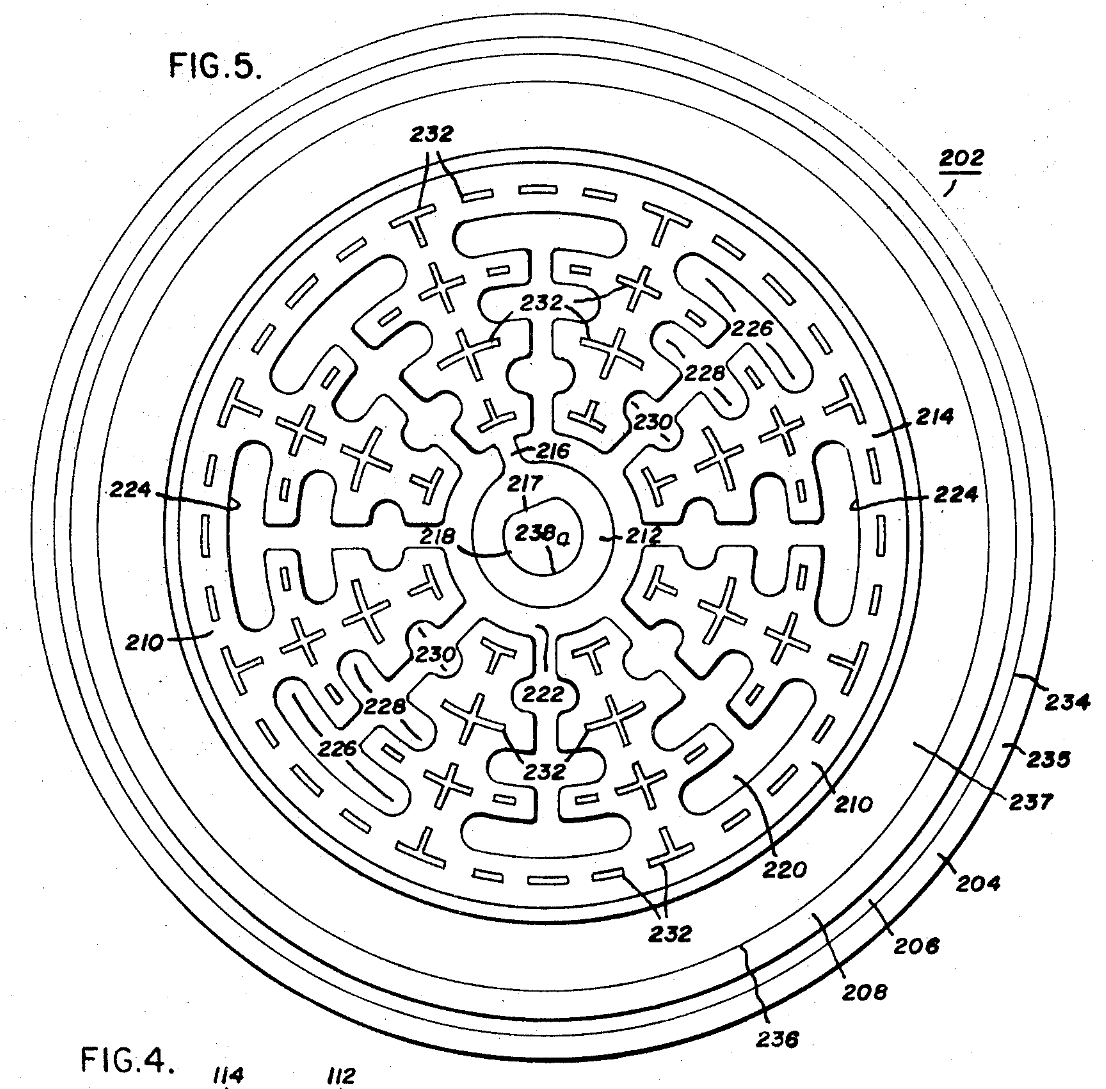
FIG. 5 is a plan view of the semiconductive element with the contact layers removed.

In FIG. 1 a controlled rectifier or thyristor 100 is shown provided with a subassembly 200. As best appreciated by reference to FIGS. 2 through 6 inclusive the subassembly 200 includes a semiconductive element 202. The semiconductive element is shown provided with a P-type conductivity anode emitter layer 204, an N-type conductivity anode base layer 206, a P-type conductivity cathode base layer 208, and an N-type conductivity anode emitter layer 210. The cathode emitter layer can be seen to be formed of a centrally located annular ring or pilot portion 212 connected to a spaced, surrounding main emitter layer portion 214 by a bridge portion 216. The pilot portion is provided with a flat 217 on its inner periphery circumferentially positioned adjacent the bridge portion. It is to be noted that as shown all of the cathode emitter layer portions have their upper surfaces lying in a single plane which forms the upper surface of the semiconductive element.

The cathode base layer is provided with a central or pilot gate portion 218 located centrally of the pilot portion of the cathode emitter layer. Surrounding the pilot portion of the cathode emitter layer, the cathode base layer presents a main gate surface portion 220 comprised of a central portion 222 which surrounds and conforms to the pilot portion of the cathode emitter layer and a plurality of radiating finger portions 224. The central portion of the main gate surface separates the pilot and main portions of the cathode emitter layer. The finger portions branch radially outwardly from the central portion and are radially distributed so that an interdigitated relationship is created between the finger portions and the main portion of the cathode emitter layer. To decrease the mean distance between the finger portions and spaced portions of the main portion of the cathode emitter layer, while limiting the areal extent of the finger portions the finger portions are provided with lateral branches 226, 228, and 230. It is noted that the branches 226 lying nearest the perimeter of the semiconductive element are longer than the branches 228 which are in turn longer than branches 230. As shown the lengths of the branches are chosen so that spacing between corresponding branches of adjacent finger portions are equal. Thus, any tendency of the radially oriented finger portions to diverge toward the periphery of the semiconductive element is offset. The entire main gate surface portion of the cathode base layer lies below the surface plane of the cathode emitter layer—that is, the main gate surface portion lies nearer the anode emitter layer than does the surface of the cathode emitter layer.

The cathode base layer is additionally provided with a plurality of spaced portions or regions 232 located so as to be surrounded by the main portion of the cathode emitter layer. Regions 232 are shown located along radially extending lines equidistant from adjacent finger portions. Remaining of the regions which are nearer one finger portion than another are located equidistant from adjacent branches of the nearest adjacent finger portion. Other regions 3 peripherally of the finger portions are noted to lie centered between the outer perimeter of the main portion of the cathode emitter layer and the outer edge of the finger portions. The regions 232 extend upwardly to the surface plane formed by the surface of the cathode emitter layer. It can be seen that the regions 232 have been located to preempt those areas of the main portion of the cathode emitter layer which would otherwise be most remote from the surface intersection of the cathode base and emitter layers. Alternatively viewed, the regions 232 contact those portions of the main portion of the cathode emitter layer that are most remote from the surface intersection of the cathode emitter layer with the main gate surface portion and peripheral surface portion of the cathode base layer.

The anode emitter layer and the anode base layer form an anode emitter junction 234 at their interface. Similarly the anode and cathode base layers form a collector junction 236 at their interface. The pilot portion of the cathode emitter layer and the cathode base layer form a pilot emitter junction **238*a* at their interface. Similarly the main portion of the cathode emitter layer an the cathode base layer form a main cathode emitter junction 238*b*** at their interface. It is, of course, appreciated that the pilot and main cathode emitter junctions are in reality a single continuous junction, since the bridge portion of the cathode emitter layer connects the pilot and main portions thereof.

It is noted that the semiconductive element is peripherally beveled. A first annular beveled edge 235 is provided to intersect the anode emitter junction 234. A second annular beveled edge 237 is provided to intersect the collector junction 236. Since the semiconductive element is typically formed by diffusing a P-type dopant into an N-type semiconductive element to form junctions 234 and 236, it is appreciated that the P-type layers forming the cathode base and anode emitter layers exhibit a lower resistivity than the anode base layer. Accordingly, in the form shown the annular beveled edge 235 forms a positive bevel angle with the anode emitter junction while the annular beveled edge 237 forms a negative bevel angle with the collector junction. I have observed that the semiconductive element can withstand higher blocking voltages and can be protected from destructive surface voltage breakdown by negatively beveling the semiconductive element adjacent its intersection with the collector junction in the range of from 1° to 20°. Preferably the collector junction is negatively beveled in the range of from 3° to 9°. Similar improvement for the semiconductive element may be achieved by positively beveling the semiconductive element adjacent the anode emitter junction at an angle of less than 90°. It is, of course, appreciated that the positive and negative bevel angles may be identically chosen so that annular beveled edges 235 and 237 in effect merge into a single annular sloped edge for the semiconductor element. This has the advantage of reducing the cost of beveling. In practice I prefer to utilize a somewhat steeper bevel angle adjacent the anode emitter junction than the collector junction, since the anode emitter junction has a less critical effect in many applications and steepening the bevel angle adjacent the anode emitter junction reduces significantly the diameter of the semiconductive element over that required with a less steep bevel angle or a single bevel angle across both collector and anode emitter junctions; however, the reduction in the diameter of the semiconductive element in this manner does not significantly reduce the overall current handling capability of the device.

In addition to the semiconductive element 202 the subassembly 200 also includes a pilot gate contact layer 240, a main gate contact layer 242, and a cathode contact layer 244. The pilot gate contact layer is centrally positioned on the pilot gate portion of the cathode base layer. The main gate contact layer overlies the annular pilot portion of cathode emitter layer and the main gate surface portion of the cathode base layer. The main gate contact layer traverses the pilot emitter junction on the outer periphery of the annular pilot portion of the cathode emitter layer, but is otherwise spaced from the cathode emitter junction. The cathode contact layer contacts only the main portion of the cathode emitter layer and the peripheral portion of the cathode base layer that surrounds the main portion of the cathode emitter layer. A plurality of inserts 246 are formed in the outer edge cathode contact layer so that the cathode emitter layer does not overlie the entire surface intersection of the cathode emitter layer periphery and the cathode base layer periphery.

To provide an electrical connection to the anode emitter layer the subassembly is provided with a backup plate 250 formed of a metal having a thermal coefficient of expansion approximating that of the semiconductive material forming the semiconductive element. For silicon semiconductive elements the backup plate is preferably formed of a metal, such as tungsten, molybdenum, or tantalum, which exhibits a thermal coefficient of expansion of less than $1\times10^{15}$in/in per ° C., most preferably less than $0.5\times10^{5}$in/in per ° C. The back up plate is soldered or otherwise conductively secured to the surface of the anode emitter layer in a conventional manner. A thin layer 252 formed of a malleable metal, such as gold or silver, is provided on the lower major surface of the back up plate.

To complete the subassembly a resilient annular member 254 is provided to mechanically locate and cushion the subassembly as well as to protect the collector and anode emitter junctions from contaminants. The annular member is formed of a junction passivant material having a relatively high insulative resistance and dielectric strength and is substantially impervious to junction contaminants. I prefer to utilize in forming the annular member conventional passivants having a dielectric strength of at least 100 volts/mil and an insulative resistance of at least $10^{10}$ ohm-cm. A number of commercially available forms of silicone rubber are noted to meet these electrical criteria. In the form shown the annular member is formed by molding silicone rubber to the periphery of the semiconductive element and backup plate. It is anticipated that instead of relaying entirely upon the annular member to protect the collector and anode emitter junctions from contamination another passivant may be interposed between the semiconductive element and the annular member. For example, it is anticipated that a conventional glass passivant could be interposed. In such instance it is essential that the annular member be formed of a passivant material, although this is preferred in order to supplement the glass passivant and to guard against any imperfections in the glass passivation layer that could otherwise provide contaminant access to the junctions.

When assembled in the controlled rectifier 100 as shown in FIG. 1, the subassembly is placed on pedestal portion 102 of the terminal member 104, so that the thin malleable layer 252 of backup plate 250 forms a low impedance ohmic contact therewith under compression. The terminal member 104 is welded or otherwise sealingly secured to an annular flange 106. The flange is in turn sealingly secured to an annular electrically insulative ring 108. The ring is preferably formed of a material having a high dielectric strength, such as glass or ceramic materials. The exterior surface of the ring is provided with four (as shown) annular protrusions 110 to increase the exterior surface distance between the opposite extremities of the ring. The annular member 254 engages the interior surface of the ring to center the subassembly on the pedestal portion of the terminal member 104. Since the annular member is preferably resilient, it also protects the subassembly from mechanical shocks which may be received by the ring.

Annular backup plate 112 overlies the subassembly 200 and rests on the cathode contact layer 244. The annular backup plate may be formed of the same materials as backup plate 250, but is not limited to metals having a thermal coefficient of expansion which as closely matches that of the semiconductive element, when the annular backup plate is not directly bonded to the semiconductive element. While it is contemplated that the cathode contact layer, the main gate contact layer, and the pilot gate contact layer will all be bonded directly to the semiconductive element, these layers may be formed of any of a wide variety of metals known to be capable of forming adherent layers to semiconductive elements, such as aluminum, gold, silver, vanadium, platinum, nickel, tungsten, chromium, molybdenum, tantalum, and multilayer combinations. This is accomplished by maintaining the contact layers thin, in the order of from 100 A. to 1 mil in thickness, so that the amount of thermal stress that may be transmitted to the semiconductive element by the contact layers remains negligibly small, despite large differences in thermal expansion characteristics. Of course, where the contact layers are formed of metals that approximate the thermal expansion characteristics of the semiconductor material, they may be increased in thickness. Noting FIG. 4 it can be seen that the annular backup plate is supported on the cathode contact layer, but is spaced from the main gate contact layer. The annular backup plate carries on its upper surface a thin malleable layer 114 similar to malleable layer 252.

The annular backup plate is held centered with respect to the subassembly 200 by annular centralizer 116 which cooperates with the inner edge of the annular backup plate and a lower contact portion 118 of a gate lead spring 120. The centralizer is preferably formed of a dielectric material. The outer extremity of the gate lead spring is slidably fitted into a recess 122 in gate terminal member 124. The gate terminal member is sealingly associated with the ring 108.

A pedestal portion 125 of housing terminal member 126 rests on the malleable layer of the annular backup plate and is capable upon compression of forming a low impedance ohmic contact therewith. The terminal member 126 is identical to terminal member 104, except that it is provided with a central slot 128 within which an insulative lining 130 is located. The slot allows the gate lead spring access to the central upper surface of the semiconductive element while the lining prevents shorting of the gate lead spring to the housing terminal member 126. The slot also prevents the gate lead spring from twisting laterally. The housing terminal means is sealingly united to flanged 132 which is in turn provided with a peripheral rim portion 134. A cooperating rimmed flange 136 is sealing joined to the insulative ring.

It is considered that techniques for forming the individual elements of my controlled rectifier are well understood in the art and that no useful purpose would be served by redescribing them. In assembling my controlled rectifier, the terminal member 104, flange 106, ring 108, gate terminal 124, and rimmed flange 136 are initially united to form a lower housing portion. The backup plate 250 with its thin malleable layer 252 attached and the semiconductive element 202 with the contact layers 240, 242, and 244 attached are joined to the molded annular member 254. The resulting subassembly 200 is then dropped onto the pedestal portion of the lower housing terminal member. The centralizer 116 is then fitted to the inner edge of the annular backup plate 112 which is then placed over the cathode contact layer. The gate lead spring 120 is inserted into the recess 122 of the gate terminal and rotated with its lower end 118 being forcibly deflected upwardly so that it enters the central aperture in the centralizer. The terminal member 126 is attached to the flange 132 to form an upper housing portion. The upper housing portion with the lining 130 in the slot 128 of the terminal member is then positioned so that the pedestal portion 124 overlies the annular backup plate. The slot 130 is aligned to receive the gate lead spring.

The flange 132 is located so that the rim portion 134 preferably engages the rimmed flange 136 after the pedestal portion 124 of the terminal member 126 compressively engages the malleable layer 114 on the upper surface of the backup plate. The rim portion 134 and rimmed flange 136 are then cold welded into sealing relationship while transmitting a compressive force between the housing terminal members. When the rectifier is placed into use, compressive forces are applied to the upper and lower terminal member 126 and 104 as is well understood in the art so that the subassembly 202 is provided with a low impedance ohmic contact to the housing terminal members.

My gate controlled rectifier or thyristor 100 is capable of being substituted for conventional thyristors having a cathode base gate lead. My controlled rectifier, however, by reason of its unique structure is capable of blocking higher terminal voltages, withstanding higher rates of voltage and current increase, even at high repetition rates, and being switched from the blocking state to the conducting state with a lower gate signal than comparable conventional thyristors.

Certain aspects of the operation of my controlled rectifier 100 can be appreciated by considering the subassembly 200 as a pilot or gate signal amplifying thyristor and a main thyristor which are structurally integrated by common anode emitter, anode base, and cathode base layers. As can be seen the pilot or signal amplifying thyristor is comprised of the annular pilot portion 212 of the cathode emitter layer as well as the portions of the cathode base layer 208, anode base layer 206, and anode emitter layer 204 which lie beneath the pilot portion of the cathode emitter layer. The main thyristor is formed of the remaining portions of the anode emitter, anode base, and cathode base layers as well as the main portion 214 of the cathode emitter layer.

In considering the forward and reverse voltage blocking capabilities of the controlled rectifier, it can be seen that since the pilot or gate signal amplifying thyristor is centrally structurally integrated with the main thyristor it has no external edge surface to be affected by voltage gradients. Accordingly, structural integration of the pilot thyristor in the center of the main thyristor greatly simplifies the matter of improving voltage blocking capabilities over what would be encountered if it were attempted to form the pilot thyristor separate from the main thyristor. Surface breakdown of my integrated combination of thyristors is achieved merely by beveling the outer edge of the main thyristor. The annularly beveled edge 235 which intersects the anode emitter junction is positively beveled to increase the reverse blocking voltage capability of the thyristor while the annular beveled edge 237 which intersects the collector junction is negatively beveled to increase the forward blocking voltage that can be applied without surface breakdown. These two beveled edges together with the annular member 254 which serves as a junction passivant protecting the edge surface of the main thyristor against contamination allow high terminally applied potential differences to be blocked.

Figure 7:
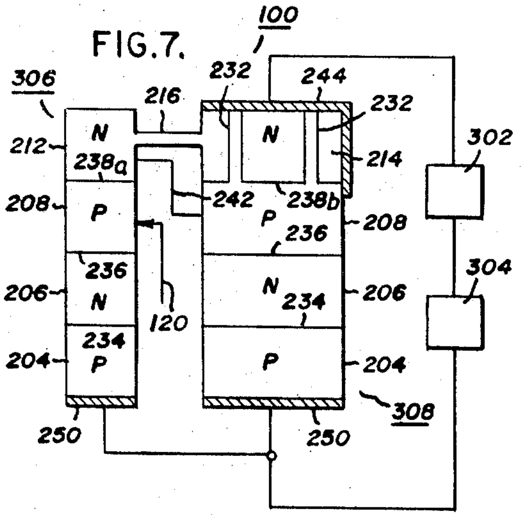
FIG. 7 is a schematic functional diagram.

Turn on of the controlled rectifier 100 may conveniently be analyzed in terms of first turning on the pilot thyristor which produces as its output an amplified gate signal that drives the main thyristor into the conducting state. For ease of visualization, attention is directed to FIG. 7, which is a schematic functional diagram of my controlled rectifier 100 shown electrically connected in series with a potential source 302 and a load 204. It is appreciated that the functional diagram merely approximates certain functional aspects of my controlled rectifier and does not represent a full functional equivalent as to all performance characteristics of my device. Corresponding features of the controlled rectifier schematically shown in FIG. 7 are given like reference characters as employed with reference to FIGS. 1 through 6 inclusive.

Assuming that the backup plate 250 adjacent the anode emitter layer 204 is positive with respect to the cathode contact layer 244 so that the device is initially in the forward voltage blocking state, the thyristor 100 is turned on by applying a gate signal through gate lead spring 120 to the cathode base layer 208. In actual practice the gate signal is transmitted through the pilot gate contact layer 240 to the pilot gate portion 218 of the cathode base layer, which is located centrally of the pilot portion of the cathode emitter layer. As in conventional practice the gate signal is chosen to be positive with respect to the cathode contact layer, but typically is less positive than the backup plate 250.

The pilot thyristor turns on initially by conduction between the pilot gate contact layer and the flat 217 associated with the inner edge of the annular pilot portion. The initial conducting plasma tends to spread from the flat around the periphery of the annular pilot portion. A very small fraction of the plasma may spread into the bridge portion 216 connecting the main and pilot portions of the cathode emitter layer. Plasma spreading through the bridge is, however, held to a very low level, since it is noted that the bridge portion unlike the pilot portion and the main portion of the cathode emitter layer is free of direct contact with a low impedance electrical conductor. By contrast the main gate contact layer directly overlies the pilot portion of the cathode emitter layer in low impedance ohmic contact therewith. It can then be seen that the bridge portion 216 is in effect a relatively high impedance conduction path in parallel with the very low impedance conduction path provided by the main gate contact layer, so that it has negligible influence on device operation at this stage of turn on.

As the pilot thyristor turns on, pilot portion 212 rises toward the potential of the anode backup plate 250 and delivers to the main thyristor 308 through the main gate contact layer an amplified positive gate signal. Not only does the pilot thyristor function to transmit the initial pilot gate signal to the main thyristor, but it additionally greatly amplifies the signal. Since a relatively strong amplified signal is available to the cathode emitter layer of the main thyristor, a current density sufficient to uniformly turn on the main thyristor is provided, even though the turn on signal is distributed over the entire main contact layer, including the central portion 222, the finger portion 224, and the branches 226, 228, and 230.

The interdigitation of the finger portions with the main portion 214 of the cathode emitter layer allows it to be fully turned on at a very rapid rate, so that extremely high rates of current increase can be tolerated without damage to the device. It has heretofore been recognized that the current rise time increases directly with the area of the cathode emitter layer, since the rate of lateral spreading of plasma through a cathode emitter layer on turn on is substantially constant. By interdigitating the main gate portion with the main contact portion the area of the cathode emitter junction 238*b* initially affected by the amplified gate signal applied to the adjacent portions of the cathode base layer is multiplied many times. At the same time the finger portions and connected branches allow access to the portions of the main cathode emitter layer which are normally quite remote from the origin of the amplified gate signal. The result is that the mean distance through which the plasma must spread laterally in the cathode emitter layer during turn on is greatly reduced and turn on time is correspondingly reduced.

Figure 4:
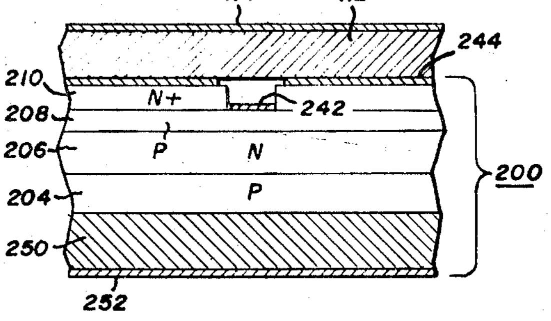
FIG. 4 is a sectional detail taken along section line 4—4 in FIG. 2
Figure 6:
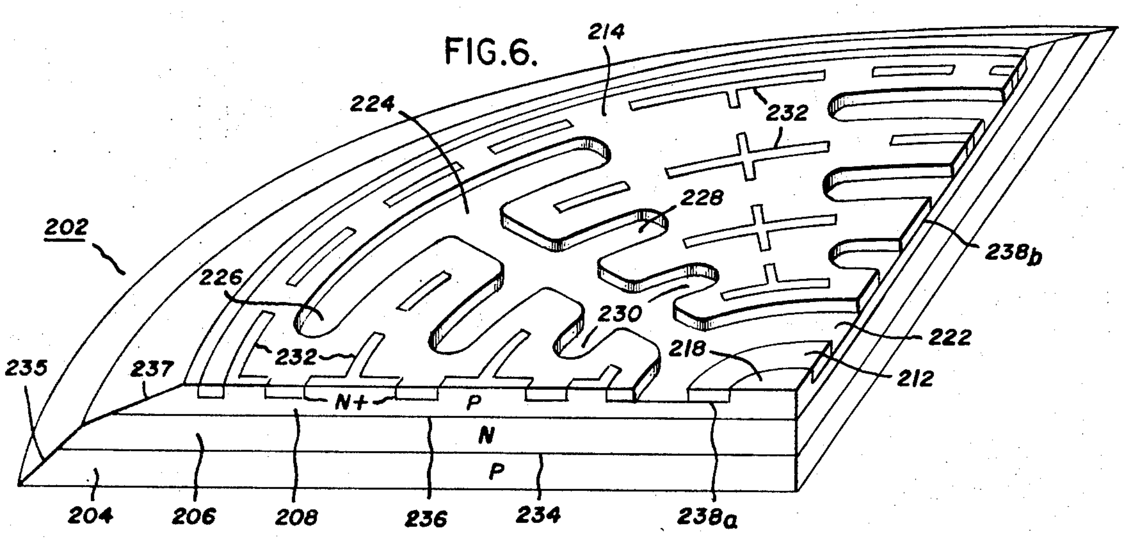
FIG. 6 is an oblique view of a quarter section of the semiconductive element.

It is to be noted that the advantage of fast turn on capability is achieved with minimum increase in the complexity of the device. For example, the annular backup plate 112 which cooperates with the cathode contact layer 244 requires no special machining or indexing to be mated to the interdigitated upper surface of the subassembly. This is attributable to the fact that the main gate surface portion of the semiconductive element is formed so that it is spaced below the upper surface of the semiconductive element. As is best illustrated in FIG. 4, this allows the annular backup plate to clear the main gate contact layer 242 so that direct ohmic contact therewith is avoided.

In building controlled rectifiers similar to controlled rectifier 100, but without the bridge portion 216 and the flat 217 associated with the inner edge of the annular pilot portion, I have observed that the devices can be quickly and reliably turned on in the manner described above, provided an adequate gate driving signal is initially supplied. With a weak gate signal applied to gate terminal 124 damage to the device has been observed to occur. This I attribute to a tendency of the pilot or gate signal amplifying thyristor to turn off prior to full turn on of the main thyristor. This causes the current being conducted by the partially turned on pilot thyristor to be crowded into a small area so that unacceptably high current densities occur which overheat and destroy the small area of the pilot thyristor that remains in the conducting state. The tendency toward turn off is believed to be attributable to the pilot portion of the cathode base layer rising toward the potential of the anode emitter layer due to turn on of the pilot thyristor. This can cause the pilot gate to be more positive than the gate voltage source thus causing a reverse current to occur out the gate, so that the pilot thyristor tends to turn off.

The function of the bridge portion 216 of the cathode emitter layer is to provide an avenue through which conducting current can spread from the pilot portion of the cathode emitter layer to the main portion. This escape route prevents the current being conducted by the pilot thyristor from being crowded so closely at the perimeter of the pilot portion that overheating and ultimate failure of the device results. Unfortunately, the bridge portion 216 is not effective unless the turn off mechanism of the pilot thyristor is such that the conducting current of the pilot thyristor is being crowded toward it. In other words, if the turn off mechanism is crowding the conducting current toward an edge of the pilot portion remote from the bridge portion, the bridge portion will be ineffective to provide an avenue for spreading the current to the main portion of the cathode emitter layer.

To assure that the bridge portion will be effective to spread the current should any tendency toward turnoff occur, as by attempting to initiate turn on with a weak gate signal, I provide on the inner edge of the pilot portion of the cathode emitter layer a flat 217. The flat is used to reduce the spacing between the pilot gate contact layer and the inner edge of the annular pilot portion, so that turn on of the annular pilot portion preferentially occurs at the flat and spreads from the flat to the remainder of the annular pilot portion. The annular location of the flat on the pilot portion is directly adjacent the bridge portion. Locating the flat adjacent the bridge portion in this manner allows the controlled rectifier to be reliably turned on without failure even with low level gate signals. In no instance has a turn off failure been observed to occur where the bridge portion and flat are used together in adjacent angular relationship. I believe that the reason for this is that the last portion of the annular pilot portion to turn off is located at the same angular location on the annular pilot portion as is the first portion to turn on. By reducing the spacing between the pilot gate contact layer and the pilot portion at a known location on the pilot portion, the point at which current will both first turn on and last turn off can be angularly fixed. Accordingly, this point can be angularly related adjacent the bridge portion so that the bridge portion is available to prevent current crowding and turn off of the pilot thyristor prior to turn on of the main thyristor is forestalled.

It is another salient feature of my controlled rectifier that it is capable of withstanding high rates of voltage increase without being switched from the blocking to the conducting state, except where this is essential to prevent destruction of the device. When my controlled rectifier is in the forward blocking condition and the potential difference across the terminals is rapidly increased to increase the forward voltage drop across the device, the width of the depletion layer associated with the blocking collector junction also rapidly increases. This causes minority carriers in the anode base layer to be swept across the collector junction into the cathode base layer. Assuming that the regions 232 of the cathode base layer were omitted, a corresponding number of holes would then cross the main portion 238*b* of the cathode emitter junction causing a large number of electrons to be injected from the cathode emitter layer into cathode base layer and across the collector junction. If the voltage increase is sufficiently rapid, a sufficient current density is built up to cause the device to switch to the conducting state, without any gate signal having been applied.

By providing the regions 232 a current conduction path is provided from the cathode base layer in parallel to the cathode emitter junction. This reduces the number of holes and electrons that cross this junction in response to a high rate of voltage increase and materially reduces any tendency of the device to turn on without a gate signal.

It is a significant feature of my invention that I locate the regions 232 of the cathode base layer so that they are surrounded by portions of the main portion of the cathode emitter layer most remote from the intersection of the main gate surface portion 220 of the cathode base layer with the cathode emitter layer. This offers two unexpected advantages. First, shorting of the cathode base layer to the cathode contact layer to improve allowable voltage increase characteristics is achieved with a very minimal influence on the gate sensitivity of the main thyristor. If the cathode base layer shorts were located near the main gate contact layer 242, a significant fraction of the gate current to the main thyristor would bypass the cathode emitter junction and the sensitivity of the main thyristor to the gate signal would thereby be decreased. Second, by locating the regions 232 so that the regions of the main emitter layer which would otherwise be most remote from the intersection of the main gate surface portion and the main emitter layer are in effect preempted or removed by the regions 232, the necessity of allowing time on turn on for current to spread laterally into these regions is eliminated and the overall turn on time of the device is improved simultaneous with improving the device capability for handling more rapid increases of voltage. This is an unexpected advantage.

It is to be noted that the cathode contact layer 244 provides a direct ohmic connection to the cathode base layer not only over the regions 232, but also around the periphery of the main portion of the cathode emitter layer. The peripheral shorting of the cathode base layer to the cathode contact layer supplements the regions 232 in preventing undesired turn on of the controlled rectifier with rapid increases of voltage. Having relatively large shorted areas near the edge of the semiconductive element is desirable, since the tendency toward turn on in response to rapid voltage increase is greatest near the periphery of the semiconductive element.

If the cathode contact layer were shorted around the entire periphery of the cathode emitter layer, the thyristor when subjected to a high static voltage level in the blocking state would be exposed to the danger of surface damage at the periphery attributable to high surface avalanche breakdown currents. To protect the device form this potential hazard the insets 246 are provided radially spaced around the periphery of the cathode contact layer. If the controlled rectifier should inadvertently be subjected to a very high static voltage across its main current carrying terminals while in the blocking state, a substantial amount of current will flow on the surface to the portion of the cathode contact layer shorting the periphery of the cathode emitter layer. Before the current reaches a destructively high level, however, the rectifier will turn on adjacent the insets 246. This transfers a portion of the current being carried at the surface of the semiconductive element to the interior and distributes the current over a larger area of conduction so as to minimize the chance of local overheating occurring on the surface. It is, of course, appreciated that beveling the periphery of the device as well as the use of annular member 254 formed of passivant supplement the insets 246 in protecting the semiconductive element from surface damage.

Figure 9:
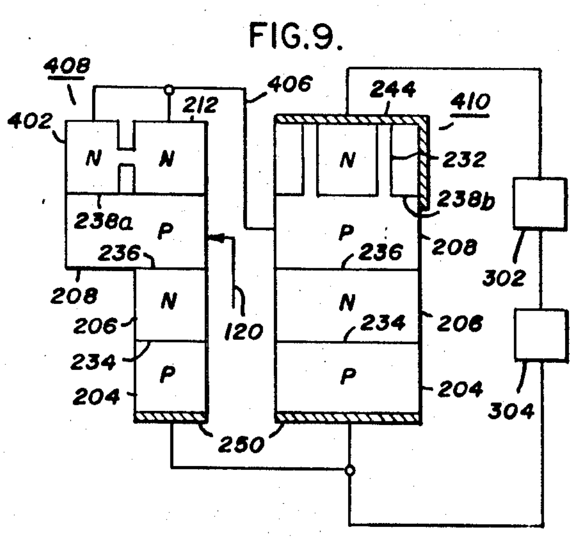
FIG. 9 is a schematic functional diagram applicable to the modified form of my invention.
Figure 8:
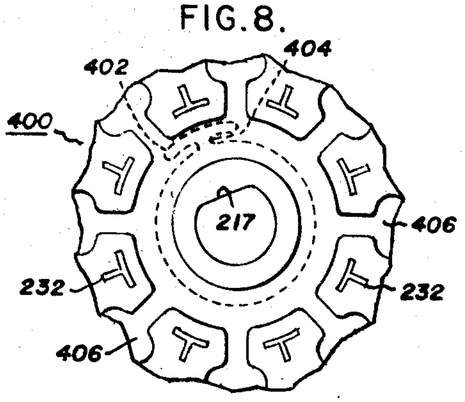
FIG. 8 is a plan detail of a modified form of a semiconductive element according to my invention with the main gate contact layer attached.

In FIGS. 8 and 9 a modified form of my invention is illustrated. Features identical to those of the controlled rectifier 100 are assigned like reference characters and are not redescribed in detail. The semiconductive element 400 is in the form shown identical to semiconductive element 202, except that the bridge portion 216 of the cathode emitter layer is omitted and an auxiliary pilot portion 402 is provided integrally connected to the annular pilot portion 212 through a relatively high impedance portion 404. The high impedance portion is located adjacent the flat 217 on the inner edge of the pilot portion. The high impedance portion 404 is preferably formed of N-type semiconductive material similarly as the remainder of the cathode emitter layer. The high impedance associated with this portion is provided by the width of the interconnection which this portion provides between the pilot portion and the auxiliary pilot portion. The high impedance may also be introduced by selectively etching this portion of the semiconductive element so that its thickness is decreased relative to that of the pilot portion and the auxiliary pilot portion. Either way it is to be noted that the high impedance portion 404 is formed of N-type semiconductive material having the same resistivity as the remainder of the cathode emitter layer. Accordingly, no special control of the cathode emitter layer formation beyond controlling the mask configuration is necessary to form the portion 404. It is recognized, however, that the portion 404 may be increased in impedance relative to the pilot portion and the auxiliary pilot portion by making this portion of relatively higher resistivity in lieu of or in combination with the techniques described above in order to achieve a high impedance interconnection. A remaining structural distinction of the modified embodiment is that the main gate contact layer 406, which is otherwise identical to main gate contact layer 242, overlies the auxiliary pilot portion and the portion 404.

The difference in function of the semiconductive element 400 may be best appreciated by reference to FIG. 9. Whereas in the arrangement of semiconductive element 202 the bridge portion 216 provides a current carrying path in parallel with the main gate contact layer 242, the arrangement of the semiconductive element 400 offers the advantage that no such parallel current carrying path exists. Accordingly the entire current output of the pilot thyristor 408 is available to act as an amplified gate signal to the main thyristor 410. This is accomplished without offsetting disadvantage, however, since the high impedance portion 404 leading to the auxiliary pilot portion 402 performs similarly as bridge portion 216 in providing an avenue for current spreading so that any tendency of the semiconductive element 400 to turn off prior to turn on of the main portion of the cathode emitter portion is forestalled.

While I have described my invention with reference to certain preferred embodiments, it is appreciated that numerous variations will readily occur to those skilled in the art allowing one or more of the advantages of my controlled rectifiers to be realized according to my teachings. For example, while I have described my inventive semiconductive elements with reference to a specific preferred semiconductor housing construction, it is appreciated that my semiconductive elements are widely applicable to conventional semiconductor controlled rectifier housings. Since the semiconductive element shown is protected around its periphery by an annular passivant member, it is not essential that the housing for the semiconductive element be hermetically sealed. Alternately, if the housing is hermetically sealed it is not essential to incorporate the annular member for the purpose of passivation, although this is preferred in order to maximize reliability of the controlled rectifiers.

My controlled rectifiers have been disclosed with reference to an arrangement having a central pilot gate lead. It is not essential that the pilot gate lead be centrally located. It is appreciated that a plurality of gate leads could be employed, for example, which would note necessarily contact the center of the semiconductive element in order to achieve rapid turn on. As a further variation, it is recognized that a peripheral annular pilot gate contact layer may be provided instead of a central pilot gate contact layer, but this is not preferred, since a relatively large portion of the semiconductive element surface would be taken up with such an annular pilot gate contact layer. If an annular pilot gate contact layer configuration were utilized, it is appreciated that the finger portions associated with main gate contact layer would then radiate inwardly rather than outwardly as shown, or omitted entirely, as these are not essential to achieving certain of the advantages of my invention. If the finger portions are ommitted, it is appreciated that maintaining the main gate surface portion of the cathode base layer closer to the anode emitter layer than the surface of the cathode emitter layer would no longer be required in order to retain the use of a cooperating backup plate requiring no indexing. Instead of a flat associated with the inner edge of the pilot portion of the cathode emitter layer, any sort of proturbance that would be more closely spaced to the pilot gate contact layer than the remainder of the pilot portion could be substituted. It is appreciated that an improvement of the rate at which current may be increased can be achieved whether or not any features are incorporated intended to improve voltage blocking or voltage increase rate parameters. For example, edge beveling and shorting of the cathode base layer to the cathode contact layer may be omitted. An unobvious advantage of applying main gate interdigitation to a controlled rectifier according to my invention is that it allows an improvement in the rate of voltage increase by reversing the pilot gate bias and that this may be used in lieu of cathode base layer shorting to the cathode or in conjunction therewith to improve this parameter. Also, in applying interdigitation of the main gate according to the teaching of my invention reverse gate biasing can be used to improve the turnoff time of the controlled rectifier, although cathode base layer shorting may be absent. As is well understood in the art "reverse gate biasing" merely indicates that current is being drawn from the gate lead. Although I have discussed my invention in conjunction with a semiconductive element having a lead associated with the cathode base layer, it is appreciated that the invention may be applied to an anode base layer gate controlled device e.g. N-type and P-type layers may be reversed from the sequence described. Still other variations will occur to those skilled in the art. Accordingly, it is intended that the scope of my invention be determined with reference to the following claims.

I claim:

1. A controlled rectifier comprising:
main current carrying semiconductive means and gate signal amplifying semiconductive means each having first, second, third, and fourth layers, adjacent of said layers being of opposite conductivity type and forming junctions therebetween,
said second, third, and fourth layers of said main semiconductive means and said amplifying semiconductive means being integrally related,
said first layer of said amplifying semiconductive means being annular and separating the surfaces of said second layers of said amplifying and main semiconductive means and said second layer surface of said main semiconductive means separating said first layers of said amplifying and main semiconductive means,
means providing a low impedance electrical interconnection between said first layer of said amplifying semiconductive means and said second layer of said main semiconductive means,
gate means in contact with said second layer surface of said amplifying semiconductive means,
means formed by said first layer of said amplifying semiconductive means to forestall turn off of said amplifying semiconductive means prior to turn on of said main semiconductive means including a current spreading avenue extending outwardly from said first layer of said amplifying semiconductive means and means for locating initial turn on and turn off of said gate signal amplifying semiconductive means angularly adjacent said current spreading avenue, and
first and second main current carrying terminal means in contact with said first layer of said main semiconductive means and said fourth layers of said semiconductive means, respectively.

2. A controlled rectifier comprising:
a semiconductive element having first and second emitter layers and two intermediate base layers, adjacent of said layers being of opposite conductivity type and forming junctions therebetween,
said first emitter layer being comprised of a pilot portion and a main portion connected by a bridge portion,
a base layer adjacent said first emitter layer having a pilot gate surface portion and a main gate surface portion separated by said pilot portion of said first emitter layer,
said main gate surface portion lying adjacent said main portion of said first emitter layer,
gate means in contact with said pilot gate surface portion,
means formed by said pilot portion of said first emitter layer to initiate conduction through said semiconductive element adjacent to said bridge portion of said first emitter layer,
low impedance electrically conductive means interconnecting said pilot portion of said first emitter layer to said main gate surface portion of said adjacent base layer, and
first and second main current carrying terminal means in contact with said main portion of said first emitter layer and said second emitter layer, respectively.

3. A controlled rectifier according to claim 2 in which said bridge portion of said first emitter layer exhibits a higher impedance than the remainder of said first emitter layer.

4. A controlled rectifier according to claim 2 in which said bridge portion is free of direct contact with any metallic conductor.

5. A controlled rectifier according to claim 2 in which said pilot portion of said first emitter layer is annular in configuration and said conduction initiating means constitutes a portion associated with an inner edge of said annular pilot portion and lying nearer said gate than any remaining portion of said pilot portion.

6. A controlled rectifier according to claim 2 in which said pilot portion of said first emitter layer is annular in configuration and said conduction initiating means constitutes a flat on the inner edge of said annular pilot portion.

7. A controlled rectifier comprising:
a semiconductive element having first and second emitter layers and two intermediate base layers, adjacent of said layers being of opposite conductivity type and forming junctions therebetween,
said first emitter layer being comprised of a pilot portion, an auxiliary pilot portion, and a main portion,
said auxiliary pilot portion and said pilot portion being integrally related through means providing an elevated impedance conductive interconnecting path therebetween,
a base layer adjacent said first emitter layer having a pilot gate surface portion and a main gate surface portion separated by said pilot portion of said first emitter layer,
said main gate surface portion lying adjacent said main portion of said first emitter layer and separating said pilot and said auxiliary pilot portions from said main portion of said first emitter layer,
gate means in contact with said pilot gate surface portion,
means formed by said pilot portion of said first emitter layer to initiate conduction through said semiconductive element adjacent to said auxiliary pilot portion of said first emitter layer,
low impedance electrically conductive means interconnecting said pilot portion of said first emitter layer to said main gate surface portion of said intermediate layer, and
first and second main current carrying terminal means in contact with said main portion of said first emitter layer and said second emitter layer, respectively.

8. A controlled rectifier according to claim 7 in which said auxiliary pilot portion is in contact with said low impedance electrically conductive means.

9. A controlled rectifier according to claim 7 in which said pilot portion of said one emitter layer is annular in configuration and said conduction initiating means constitutes a portion associated with an inner edge of said annular pilot portion and lying nearer said gate than any remaining portion of said pilot portion.

10. A controlled rectifier comprising:
a semiconductive element having first and second emitter layers and two intermediate base layers, adjacent of said layers being of opposite conductivity type and forming junctions therebetween,
said first emitter layer being comprised of an annular pilot portion and a main portion,
a base layer adjacent said first emitter layer having a pilot gate surface portion and a main gate surface portion separated by said pilot portion of said first emitter layer,
gate means overlying said pilot gate surface portion, for gate signal transmission thereto, said main gate surface portion being comprised of a portion contacting an edge of said annular pilot portion and a plurality of finger portions radiating from said contacting portion in interdigitated relationship with said main portion of said first emitter layer, low impedance electrically conductive means interconnecting said annular pilot portion of said first emitter layer to said main gate surface portion of said adjacent base layer, first main current carrying terminal means in contact with said main portion of said first emitter and overlying said main gate surface portion and said low impedance electrically conductive means in spaced, nonconductive relation thereto, second main current carrying terminal means in contact with said second emitter layer of said semiconductive element, and said adjacent base layer being in low resistance ohmic contact with said first main current carrying terminal means adjacent a portion of said low impedance electrically conductive means lying between adjacent finger portions at a location most remote from the intersection of said main portion of said first emitter layer with said main gate surface portion.

11. A controlled rectifier comprising:

a semiconductive element having first and second emitter layers and two intermediate base layers, adjacent of said layers being of opposite conductivity type and forming junctions therebetween, said first emitter layer being comprised of an annular pilot portion and a main portion surrounding and laterally spaced therefrom, a base layer adjacent said first emitter layer having a pilot gate surface located centrally of said annular pilot portion and a main gate surface portion separating said pilot portion and said main portion of said first emitter layer, centrally located gate means in contact with said pilot gate surface portion, said main gate surface portion being located nearer to the second emitter layer than is the surface of said first emitter layer, said main gate surface portion being comprised of a portion contacting an edge of said annular pilot portion and a plurality of finger portions radiating outwardly from said contacting portion in interdigitated relationship with said main portion of said first emitter layer, means in contact with said pilot portion of said first emitter layer to forestall turn off of said annular pilot portion prior to turn on of said main portion of said first emitter layer including a current spreading avenue extending outwardly from said annular pilot portion and means for locating initial turn on and turn off of said annular pilot portion angularly adjacent said current spreading avenue, low impedance electrically conductive means interconnecting said annular pilot portion of said first emitter layer to said main gate surface portion of said adjacent base layer, first main current carrying terminal means in contact with said main portion of said first emitter and overlying said main gate surface portion and said low impedance electrically conductive means in spaced, nonconductive relation thereto, said adjacent base layer being in low resistance ohmic contact with said first main current carrying terminal means at at least one location remote from said annular pilot portion and said low impedance electrically conductive means, second main current carrying terminal means in contact with said remaining emitter layer of said semiconductive element, and housing means in contact with said terminal means and surrounding said semiconductive element to protect said junctions against contamination.